(12) United States Patent
Ha

(10) Patent No.: US 8,835,321 B2
(45) Date of Patent: Sep. 16, 2014

(54) METHOD FOR FORMING FINE PATTERNS OF A SEMICONDUCTOR DEVICE

(75) Inventor: Hyoun-Jee Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 442 days.

(21) Appl. No.: 13/295,667

(22) Filed: Nov. 14, 2011

(65) Prior Publication Data

US 2012/0208361 A1 Aug. 16, 2012

(30) Foreign Application Priority Data

Feb. 14, 2011 (KR) .................. 10-2011-0012955

(51) Int. Cl.
*H01L 21/311* (2006.01)
*H01L 21/033* (2006.01)
*H01L 21/28* (2006.01)
*H01L 27/115* (2006.01)
*H01L 21/3213* (2006.01)

(52) U.S. Cl.
CPC ...... *H01L 21/32139* (2013.01); *H01L 21/0338* (2013.01); *H01L 21/28123* (2013.01); *H01L 27/11529* (2013.01); *H01L 27/11524* (2013.01); *H01L 21/0337* (2013.01)
USPC ............ 438/696; 438/697; 438/702; 438/703

(58) Field of Classification Search
CPC ............ H01L 21/0337; H01L 21/0338; H01L 21/3088; H01L 21/31144
USPC .......... 438/694, 696, 697, 699, 700, 702, 703
See application file for complete search history.

(56) References Cited

U.S. PATENT DOCUMENTS

| 7,291,560 B2 | 11/2007 | Parascandola et al. |
| 7,615,496 B2* | 11/2009 | Lee et al. ................ 438/736 |
| 2009/0154240 A1* | 6/2009 | Park et al. .............. 365/185.05 |

FOREIGN PATENT DOCUMENTS

| JP | 2007-43156 | 2/2007 |
| JP | 2009-94379 | 4/2009 |
| KR | 10-2010-0107208 | 10/2010 |

* cited by examiner

*Primary Examiner* — Jae Lee
*Assistant Examiner* — Quovaunda V Jefferson
(74) *Attorney, Agent, or Firm* — Onello & Mello, LLP

(57) ABSTRACT

A method of forming fine patterns in a semiconductor device includes forming narrow-width patterns in a first region and wide-width patterns in a second region, where the widths of the narrow-width patterns are smaller than the resolution limitations in a photolithography process used to make the semiconductor device. The first and second regions may comprise cell array regions, with memory cells in the first region and peripheral circuits for operating the memory cells in the second region. The semiconductor device can be, for example, a NAND FLASH memory device. The semiconductor memory device can be variously classified according to the type of memory cells to be integrated in the cell array region, e.g., a DRAM, an SRAM, a PRAM, a RRAM, an MRAM, and a FRAM. In other embodiments, a MEMS device, an optoelectronic device, or a processor, such as CPU or DSP, may be provided on the semiconductor substrate.

19 Claims, 16 Drawing Sheets

METHOD FOR FORMING FINE PATTERNS OF A SEMICONDUCTOR DEVICE

CROSS-REFERENCE TO RELATED APPLICATIONS

This U.S. non-provisional patent application claims priority under 35 U.S.C. §119 to Korean Patent Application No. 10-2011-0012955, filed on Feb. 14, 2011, in the Korean Intellectual Property Office, the entire contents of which are hereby incorporated by reference.

FIELD

The inventive concepts relate generally to a method for forming fine patterns in a semiconductor device. More particularly, the inventive concepts relate to a method of simultaneously forming patterns having widths different from each other.

BACKGROUND OF THE INVENTION

A semiconductor device includes patterns formed using a photolithography process. Widths of patterns in the semiconductor device are being rapidly reduced in order to meet the demands of high-density semiconductor devices. However, due to resolution limitations in photolithography processes, it becomes difficult to form such narrow patterns. For instance, fine patterns, whose widths are smaller than the resolution limitations in photolithography processes, cannot be formed using only the photolithography process.

In addition to the narrow patterns, the semiconductor device further includes wide patterns whose widths are greater than that of the narrow patterns. The presence of the wide patterns leads to increases in cost and time of semiconductor-device-fabricating processes.

SUMMARY

Embodiments of the inventive concepts provide methods of forming fine patterns in a semiconductor device. The fine patterns have widths less than a width of a photolithography process used in forming the semiconductor device.

According to one aspect of the inventive concepts, provided is a method of forming fine patterns in a semiconductor device. The method includes forming an underlying layer with a first region and a second region, forming hardmask patterns on the underlying layer, the hardmask patterns having the substantially same width but being arranged at intervals different in the first region from in the second region, and forming spacers on both sidewalls of each of the hardmask patterns. The method also includes forming gap-filling patterns to fill gap regions between the spacers; forming a trimming mask pattern to expose at least one of the gap-filling patterns on the second region; performing a trimming process to remove the gap-filling pattern exposed by the trimming mask pattern and a pair of the hardmask patterns adjacent to the exposed gap-filling pattern; and removing the trimming mask pattern and the spacers and patterning the underlying layer using the gap-filling patterns and the hardmask patterns as an etch mask to simultaneously form narrow-width patterns on the first region and wide-width patterns on the second region.

A width of the gap-filling pattern on the first region can be the substantially same as a width of the spacer.

The spacers can be formed of a material having an etch selectivity with respect to the gap-filling patterns and the upper mask patterns. And the trimming process can comprise isotropically etching the gap-filling pattern exposed by the trimming mask pattern and the spacers adjacent to the exposed gap-filling pattern to expose sidewalls of the upper mask pattern and the gap-filling pattern. The trimming process can also include simultaneously and isotropically etching the upper mask pattern and the gap-filling pattern whose sidewalls are exposed.

The trimming mask pattern can be formed to expose top surfaces of the exposed gap-filling pattern on the second region exposed by the trimming mask pattern and the spacers adjacent to the exposed gap-filling pattern.

The gap-filling patterns can be formed of a material having an etch selectivity with respect to the spacers, and selected from a group consisting of silicon oxide, silicon nitride, silicon oxynitride, polysilicon, and a carbon-containing layer.

The forming of the hardmask patterns can include forming a hardmask layer on the underlying layer, forming photoresist patterns on the hardmask layer, forming sacrificial spacers on both sidewalls of the photoresist patterns, and patterning the hardmask layer using the sacrificial spacers as a patterning mask.

A width of the photoresist pattern on the first region can be smaller than a width of the photoresist pattern on the second region.

A width of the wide-width pattern can be smaller than a width of the photoresist pattern on the second region.

The hardmask layer can be formed of at least one of silicon oxide, silicon nitride, silicon oxynitride, polysilicon, a carbon-containing layer, and any combination thereof.

The narrow-width patterns and the wide-width patterns can form a portion of a memory cell array.

The narrow-width patterns can form a portion of a memory cell array and the wide-width patterns can form a portion of a peripheral circuit connected to the memory cell array.

According to another aspect of the inventive concepts, a method of forming fine patterns in a semiconductor device may include forming a lower mask layer on an underlying layer having a first region and a second region, forming upper mask patterns on the lower mask layer, with intervals between the upper mask patterns being greater in the second region than in the first region, forming spacers on both sidewalls of each of the upper mask patterns, forming gap-filling patterns to fill gap regions between adjacent ones of the spacers, with widths of the gap-filling patterns being greater in the second region than in the first region, forming a trimming mask pattern to expose at least one of the gap-filling patterns on the second region, performing a trimming process to remove the gap-filling pattern exposed by the trimming mask pattern and a pair of the upper mask patterns adjacent to the exposed gap-filling pattern, removing the trimming mask pattern and the spacers and patterning the lower mask layer using the upper mask patterns and the gap-filling patterns as an etch mask to form lower mask patterns having widths that are different in the first region from in the second region, and patterning the underlying layer using the lower mask patterns as a patterning mask to simultaneously form narrow-width patterns and wide-width patterns having different widths.

The spacers can be formed of a material having an etch selectivity with respect to the gap-filling patterns and the upper mask patterns. And the trimming process can include isotropically etching the gap-filling pattern exposed by the trimming mask pattern and the spacers adjacent to the exposed gap-filling pattern to expose sidewalls of the upper mask pattern and the gap-filling pattern and simultaneously and isotropically etching the upper mask pattern and the gap-filling pattern having exposed sidewalls.

The forming of the upper mask patterns can include forming an upper mask layer on the lower mask layer, forming photoresist patterns on the upper mask layer, widths of the photoresist patterns being greater in the second region than in the first region, forming sacrificial spacers on both sidewalls of each of the photoresist patterns, and patterning the upper mask layer using the sacrificial spacers as an etch-mask.

A width of the wide-width pattern can be smaller than a width of the photoresist pattern disposed on the second region.

According to another aspect of the inventive concepts, provided is a method of forming a semiconductor device having fine patterns. The method includes sequentially forming an underlying layer, a capping layer, and a hardmask layer on a substrate having first and second regions. The method also includes forming first and second photoresist patterns on the hardmask layer using a photolithography process, the first and second photoresist patterns having widths that are equal to or greater than a resolution width of the photolithography process, forming upper mask patterns in the hardmask layer using the photoresist patterns, wherein the upper mask patterns in the first region have a smaller interval than the upper mask patterns in the second region, and forming spacers in sidewalls of the upper mask patterns, and filling gaps between the spacers with a gap-filling pattern. The method also includes removing a portion of the gap-filling pattern in the second region and then removing the spacers in the first and second regions and forming narrow-width patterns in the first region and wide-width patterns in the second region by patterning the capping layer and underlying layer using the remaining upper mask patterns and remaining gap filling pattern. A width of the narrow-width patterns is smaller than the resolution width of the photolithography process.

The method can further comprise, prior to forming upper mask patterns in the hardmask layer, forming first spacers on sidewalls of the photoresist pattern.

The narrow-width patterns and wide-width patterns can be stacking structures formed on the semiconductor substrate and comprising portions of the capping layer and the underlying layer.

The method may further include forming memory cells in the first region and forming peripheral circuits for operating the memory cells in the second region.

The method can further include forming a cell array region comprising the first region and the second region, including a plurality of cell strings, wherein each of the cell strings includes ground and string selection transistors connected to a source region and a drain region, respectively, and a plurality of cell transistors disposed in series between the ground and string selection transistors. The method can also include providing in the cell array region a ground selection gate line, a string selection gate line, and a plurality of word lines interposed between the string selection gate line and the ground selection gate line may be disposed. The word lines can correspond to the narrow-width patterns in the first region and the ground and string selection gate lines can correspond to the wide-width patterns in the second region.

BRIEF DESCRIPTION OF THE DRAWINGS

Aspects of the present invention will be more clearly understood with reference to the accompanying drawings.

FIGS. 1 through 13 are sectional views illustrating various stages of a semiconductor device made by an example embodiment of a method of forming a semiconductor device having fine patterns, according to aspects of the present invention;

FIG. 14 is a plan view of an example embodiment of a NAND FLASH memory device fabricated by the method of forming a semiconductor device having fine patterns of FIGS. 1 through 13, according to aspects of the present invention;

FIG. 15 is a sectional view of the NAND FLASH memory device of FIG. 14; and

Figure 1:
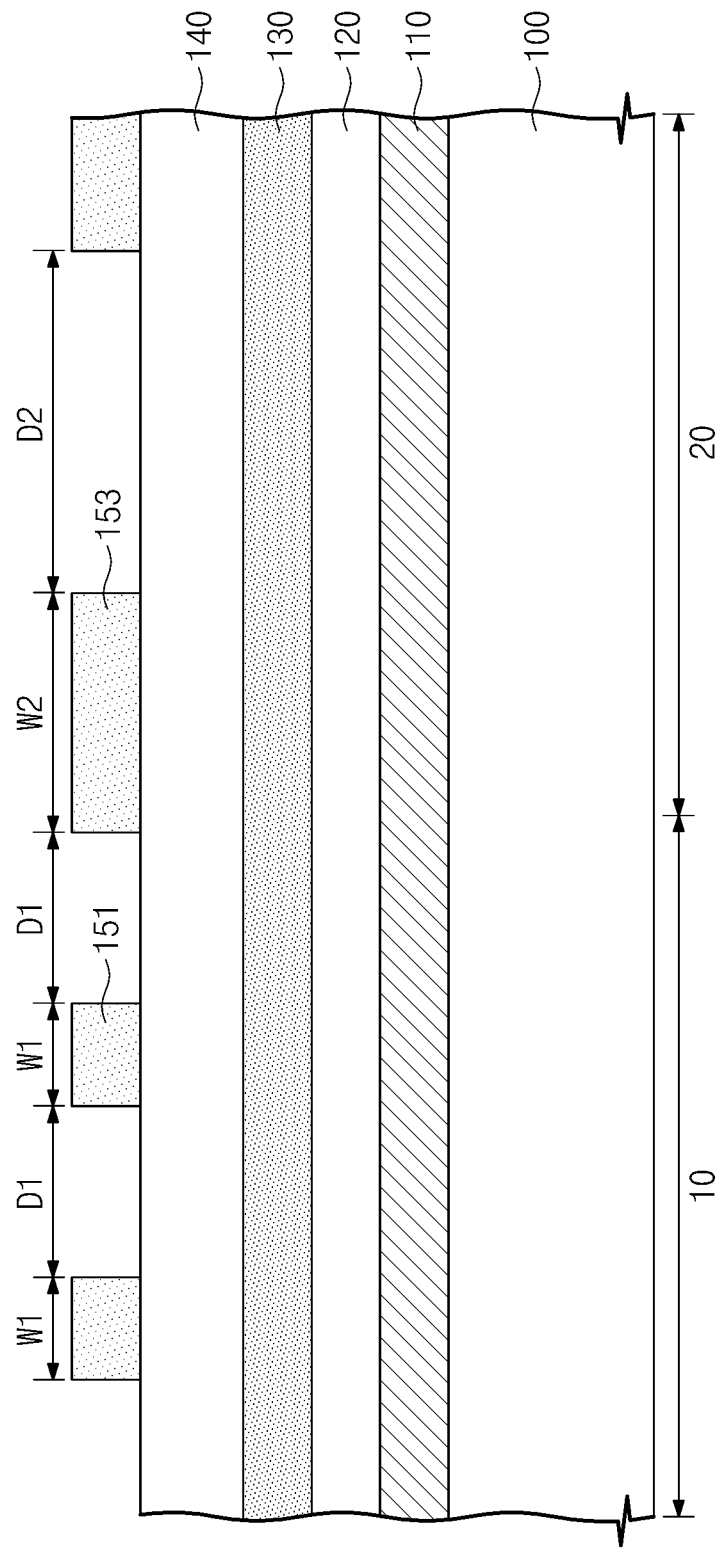
FIGS. 1 through 15 represent non-limiting, example embodiments demonstrating aspects of the present invention, as described herein.

It should be noted that these figures are intended to illustrate general characteristics of example embodiments of methods, structures and/or materials as according to aspects of the present invention, which supplement the written description provided herein. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments in accordance with the inventive concepts will now be described more fully with reference to the accompanying drawings, in which example embodiments are shown. The inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their repeated description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of the example embodiments. As such, variations in the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

According to aspects of the present invention, a semiconductor device may be configured to include fine patterns whose widths are smaller than the feasible minimum feature size. Hereinafter, the minimum feature size refers to a minimum pattern width that can be printed by a photolithography system. In some embodiments, the fine patterns may be formed by forming a spacer on a sidewall of mask pattern. In addition to the fine patterns, the semiconductor device may further include wide patterns whose widths are greater than or equivalent to the minimum feature size accommodated by the photolithography system, as customarily used. According to aspects of the present invention, the fine and wide patterns may be simultaneously formed using the same process, and this enables simplification of the process of fabricating the semiconductor device.

FIGS. 1 through 13 are sectional views illustrating an embodiment of a method of forming fine patterns in a semiconductor device, according to aspects of the inventive concepts. Fine patterns have narrow widths, also referred to as narrow-width patterns, where widths of the narrow-width patterns are smaller than the resolution limitations in a photolithography process used to make the semiconductor device.

Referring to FIG. 1, a semiconductor substrate 100 including a first region 10 and a second region 20 may be provided. For instance, the first region 10 may be a region where narrow-width patterns are formed in a high pattern density, and the second region 20 may be a region where wide-width patterns are formed in a low pattern density. As a result, widths of patterns in the first region 10 may be different from widths of patterns in the second region 20. In some embodiments, narrow-width patterns may be provided in the first region 10, and wide-width patterns may be provided in the second region 20, as is shown in FIG. 1. In some embodiments, the first region 10 may be a cell array region where memory devices are disposed, and the second region 20 may be a peripheral circuit region or a core region where peripheral circuits for operating the memory devices are disposed. In other embodiments, both of the first and second regions 10 and 20 may be portions of the cell array region where memory devices are disposed, but narrow-width and wide-width patterns are disposed in the first and second regions 10 and 20, respectively.

An underlying layer 110 may be formed on the semiconductor substrate 100. The underlying layer 110 may be used to form at least one of the patterns constituting a semiconductor device, such as a gate line, a bit line, or an active pattern. In some embodiments, the underlying layer 110 may be formed of one of a conductive layer, a semiconductor layer, an insulating layer, or any combination including multilayers thereof.

In the case where the underlying layer 110 is used to form the gate lines or the bit lines, the underlying layer 110 may include a conductive layer, such as a conductive polysilicon layer, a metal layer, or a metal silicide layer. In the case where the underlying layer 110 is used to form the active patterns of the semiconductor device, the underlying layer 110 may be a portion of the semiconductor substrate 100 or be formed of the same material as the semiconductor substrate 100. In some embodiments, the underlying layer 110 may be used to form mask patterns, which may be used as an etching mask in subsequent patterning processes. For instance, the underlying layer 110 may be formed of an oxide layer, such as a thermal oxide layer, a chemical vapor deposition (CVD) oxide layer, a high-density plasma (HDP) oxide layer, or an undoped silicate glass (USG) layer, a spin on glass (SOG) layer, and a tetraethylorthosilicate (TEOS) layer, as examples. Alternatively, the underlying layer 110 may be formed of a nitride layer, such as SiON, SiN, SiBN, and BN, as further examples. Furthermore, the underlying layer 110 may be formed of a high-k dielectric, in some embodiments.

A capping layer 120, a first hardmask layer 130, and a second hardmask layer 140 may be sequentially formed on the underlying layer 110. In some embodiments, the capping layer 120 may be a portion of the underlying layer 110. In other embodiments, the capping layer 120 may be formed of a material having an etch selectivity with respect to the underlying layer 110. The capping layer 120, the first hardmask layer 130, and the second hardmask layer 140 may be formed of materials having different etching characteristics from each other under a specific etching condition, in some embodiments. Each of the first and second hardmask layers 130 and 140 may be a single-layered structure or a multilayered structure with two or more stacked layers, in some embodiments.

For instance, the capping layer 120 may be formed of a silicon nitride layer or a silicon oxynitride layer, and the first hardmask layer 130 may be formed of a silicon oxide layer, such as a CVD oxide layer, a HDP oxide layer, a TEOS layer, or a plasma-enhanced TEOS layer, as examples. The second hardmask layer 140 may be formed of a silicon nitride layer, a silicon oxynitride layer, a polysilicon layer, a carbon-containing layer, or any combination including multilayers thereof. In some embodiments, the carbon-containing layer may be an amorphous carbon layer (ACL).

A plurality of first and second photoresist patterns 151 and 153 may be formed on the semiconductor substrate 100, and on the underlying layer 110, the capping layer 120, and the first and second hardmask layers 130 and 140. The first and second photoresist patterns 151 and 153 may have widths that may be equivalent to or greater than the minimum feature size accommodated by the photolithography system.

In some embodiments, the first photoresist patterns 151 may be formed on the first region 10, and the second photoresist patterns 153 may be formed on the second region 20. A width W1 of the first photoresist pattern 151 may be smaller than a width W2 of the second photoresist pattern 153. In addition, an interval distance D1 between the first photoresist patterns 151 may be smaller than an interval distance D2 between the second photoresist patterns 153. In certain embodiments, the width W1 of the first photoresist pattern 151 may be greater than three times the width of the narrow-width pattern to be formed in the first region 10, and the width W2 of the second photoresist pattern 153 may be greater than the width of the wide-width pattern to be formed in the second region 20. However, the present invention is not limited to such relative differences in widths.

The first and second photoresist patterns 151 and 153 may be formed using a photolithography process. For instance, the formation of first and second photoresist patterns 151 and 153 may include coating a resist material on the second hardmask layer 140 to form a photoresist layer, and then performing an exposure and development step on the photoresist layer. In some embodiments, the photolithography process may be performed in such a way that the first and second photoresist patterns 151 and 153 have a line-and-space shape, as in FIG. 1. During the photolithography process, the exposure step may be performed using KrF laser, ArF laser, $F_2$ laser, EUV beam, or electron beam, as examples. In other embodiments, the first and second photoresist patterns 151 and 153 may be shaped like a closed loop having an opening therethrough (not shown).

In addition, an anti-reflection pattern (not shown) may be formed between the second hardmask layer 140 and the first and second photoresist patterns 151 and 153. The anti-reflection pattern may be formed of a material having an etch selectivity with respect to the second hardmask layer 140 and absorbing a light used in the exposure step. The anti-reflection pattern may be formed of an organic or inorganic compound. For instance, the anti-reflection pattern may be formed of an organic material whose etching property is similar to the photoresist layer. In some embodiments, the anti-reflection pattern may be formed of a silicon oxynitride layer. Due to the presence of the anti-reflection pattern, it is possible to suppress reflection and scattering of a light beam incident on the photoresist layer and to reduce variations in widths of the first and second photoresist patterns 151 and 153.

Figure 2:
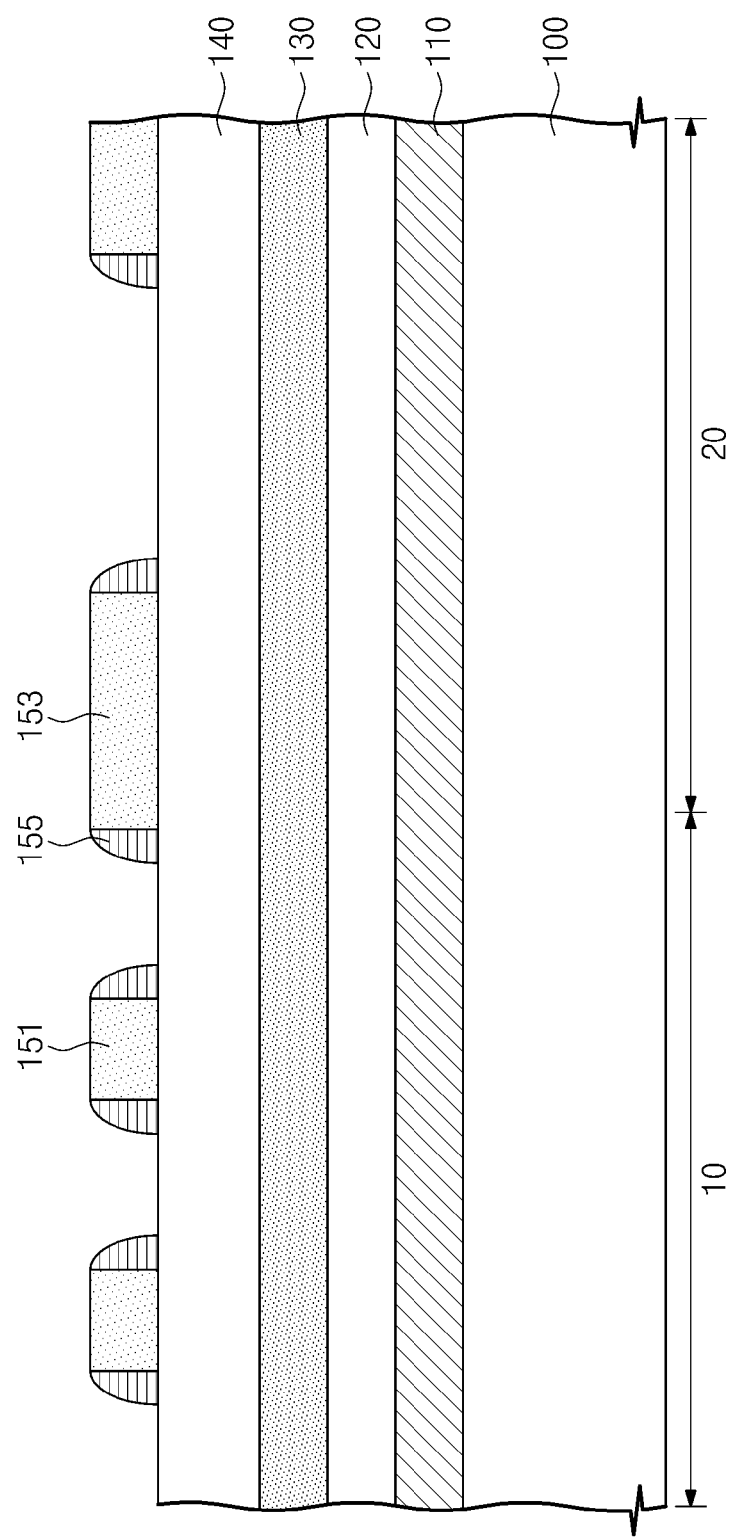

Referring to FIG. 2, first spacers 155 may be formed on sidewalls of the first and second photoresist patterns 151 and 153.

The formation of the first spacers 155 may include forming a first spacer layer on the second hardmask layer 140 to conformally cover top surfaces and sidewalls of the first and second photoresist patterns 151 and 153, and then anisotropically etching the first spacer layer to expose the second hardmask layer 140. As used herein, conformality is a layer property describing how well the topography of the underlying surface is replicated. For example, a conformal layer has substantially the same shape as the surface it covers and/or has substantially the same thickness throughout. In some embodiments, a thickness of the first spacer layer may be formed to have a width of the narrow-width pattern, which may be formed of the underlying layer 110. The first spacer layer may be formed of a material having an etch selectivity with respect to the second hardmask layer 140. For instance, the first spacer layer may be formed of a silicon oxide layer, such as an ALD oxide layer, a CVD oxide layer, a HDP oxide layer, a TEOS layer, or a plasma-enhanced TEOS layer, as examples. Alternatively, the first spacer layer may be formed of at least one of a polysilicon layer, a silicon nitride layer, or a silicon oxynitride layer, as other examples.

After the formation of the first spacers 155, the first and second photoresist patterns 151 and 153 may be removed to expose the second hardmask layer 140 between the first spacers 155.

Figure 3:
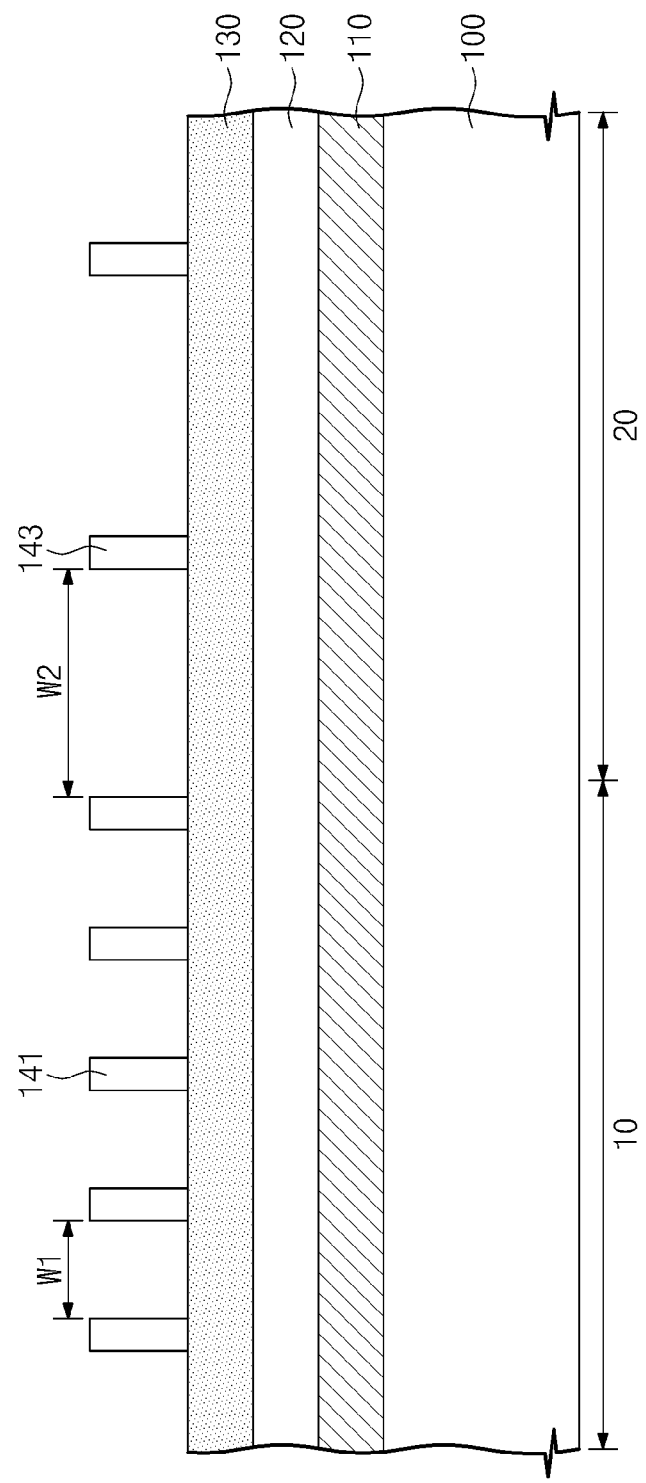

Referring to FIG. 3, the second hardmask layer 140 may be patterned using the first spacers 155 as an etch-mask to form upper mask patterns 141 and 143. As a result, first and second photoresist patterns 151 and 153 are removed, as well as portions of the second hardmask layer 140 thereunder and otherwise not masked by first spacers 155. Thereafter, the first spacers 155 remaining on the upper mask patterns 141 and 143 may be removed.

As described above, the upper mask patterns 141 and 143 may be formed using the first spacers 155 as an etch-mask, and thus, the upper mask patterns 141 and 143 may have the same width regardless of their positions. However, an interval between the upper mask patterns 141 in the first region 10 may be smaller than that of the upper mask patterns 143 in the second region 20. For instance, the interval between the upper mask patterns 141 in the first region 10 may be the substantially same as the width W1 of the first photoresist pattern 151, also shown in FIG. 1, and the interval of the upper mask patterns 143 in the second region 20 may be the substantially same as the width W2 of the second photoresist pattern 153, also shown in FIG. 1.

Figure 4:
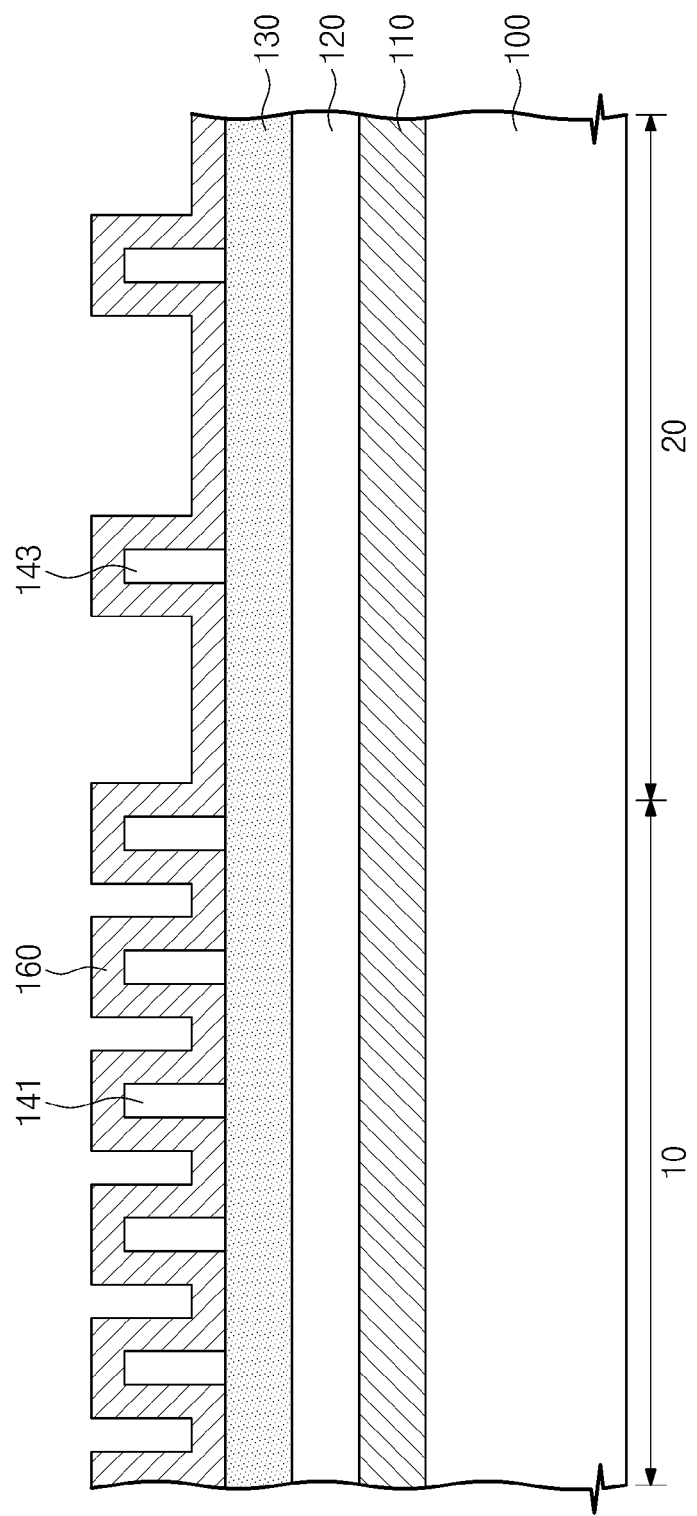

Referring to FIG. 4, a second spacer layer 160 may be formed on the first hardmask layer 130 to cover the upper mask patterns 141 and 143. The second spacer layer 160 may be formed to conformally cover top surfaces and sidewalls of the upper mask patterns 141 and 143. In some embodiments, a deposition thickness of the second spacer layer 160 may be the same as the width of the narrow-width pattern. The second spacer layer 160 may be formed of a material having an etch selectivity with respect to the first hardmask layer 130 and the upper mask patterns 141 and 143. For instance, the second spacer layer 160 may be formed of a silicon oxide layer, such as an ALD oxide layer, a CVD oxide layer, a HDP oxide layer, a TEOS layer, or a plasma-enhanced TEOS layer, as examples.

Figure 5:
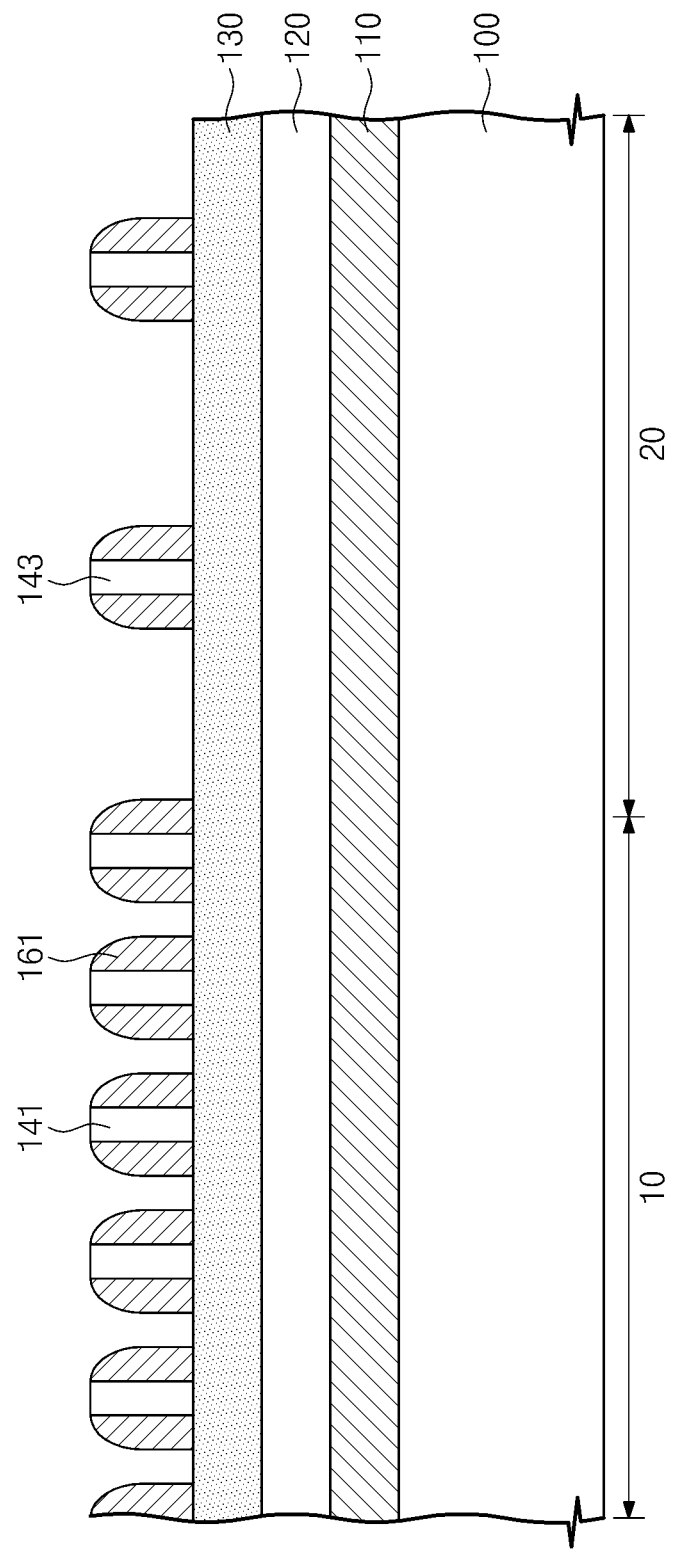

Referring to FIG. 5, the second spacer layer 160 may be anisotropically etched to form second spacers 161 on sidewalls of the upper mask patterns 141 and 143. In some embodiments, an interval between the upper mask patterns 141 in the first region 10 may be different from an interval between the upper mask patterns 143 in the second region 20, and thus, an interval between adjacent second spacers 161 in the first region 10 may be different from an interval between adjacent second spacers 161 in the second region 20. In addition, the interval between adjacent ones of the second spacers 161 in the first region 10 may be less than the width of the upper mask pattern 141 in the first region 10. In certain embodiments, the width of the second spacer 161 may be the substantially same as the width of the first spacer 155. Also, the width of the second spacers 161 may be the same as the width of the upper mask patterns 141 and 143.

Figure 6:
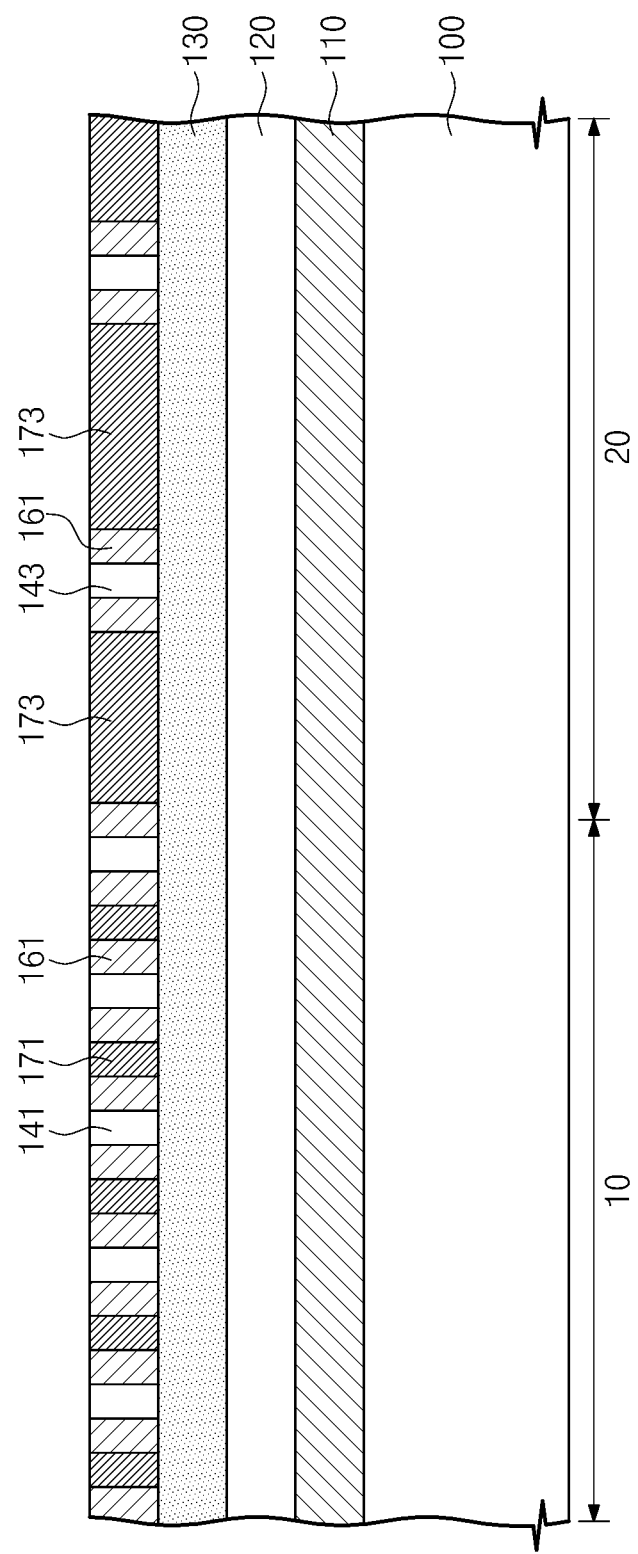

Referring to FIG. 6, first and second gap-filling patterns 171 and 173 may be formed on the first hardmask layer 130 to fill gap regions between the second spacers 161. The first and second gap-filling patterns 171 and 173 may be formed in the first and second regions 10 and 20, respectively. Since the interval between the second spacers 161 is different in the first region 10 from the interval between the second spacers 161 in the second region 20, a width of the first gap-filling pattern 171 may be different from a width of the second gap-filling pattern 173. For instance, the first gap-filling pattern 171 may have a relatively small width, compared with that of the second gap-filling pattern 173, as in the embodiment of FIG. 6.

The formation of the first and second gap-filling patterns 171 and 173 may include forming a gap-filling layer on the first hardmask layer 130 to fill the gap regions between the second spacers 161, and then planarizing the gap-filling layer to expose top surfaces of the upper mask patterns 141 and 143. The gap-filling layer may be formed of a material having an etch selectivity with respect to the second spacer 161. In some embodiments, the gap-filling layer may be formed of the same material as the upper mask patterns 141 and 143. For instance, the gap-filling layer may be formed of at least one of a polysilicon layer, a silicon nitride layer, a silicon oxynitride layer, or a carbon-containing layer, in some embodiments.

In some embodiments, the upper mask patterns 141 and 143, the second spacers 161, and the first and second gap-filling patterns 171 and 173 may constitute a mask structure. As a result of the planarization of the gap-filling layer, a top surface of the mask structure may be planarized to be substantially flat or even.

Figure 7:
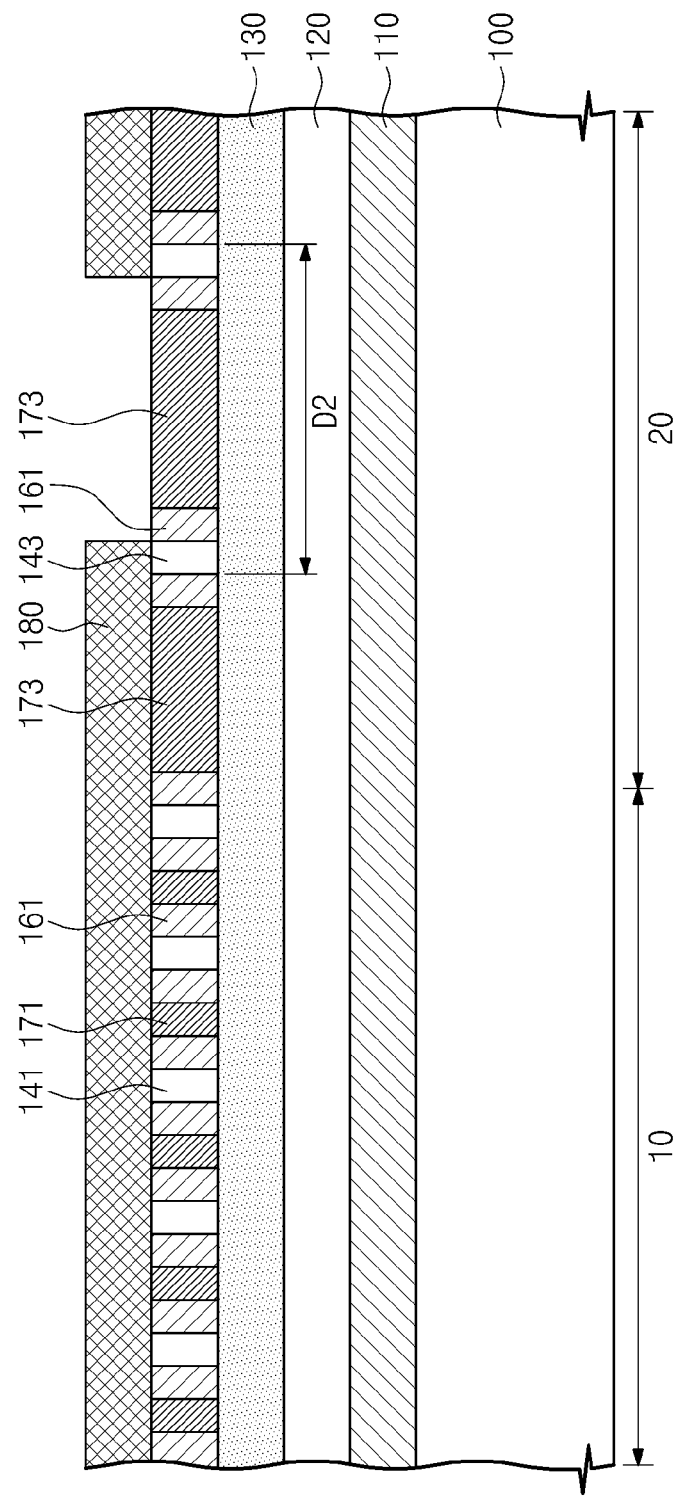

Referring to FIG. 7, a trimming mask pattern 180 may be formed on the mask structure. The trimming mask pattern 180 may be formed to expose a portion of the mask structure on the second region 20. In some embodiments, a top surface of at least one of the second gap-filling patterns 173 may be exposed by the trimming mask pattern 180. In other embodiments, at least one of the second gap-filling patterns 173 and the second spacers 161 disposed at both sides thereof may be exposed by the trimming mask pattern 180. Here, the trimming mask pattern 180 may be formed to have an opening wholly or partially exposing top surfaces of the second spacers 161, as shown in FIG. 7. For instance, the opening of the trimming mask pattern 180 may have a width equivalent to or smaller than an interval D2 between the second photoresist patterns 153 shown FIG. 1. The formation of the trimming mask pattern 180 may include coating a photoresist layer, and then performing an exposure and development step on the photoresist layer.

Figure 8:
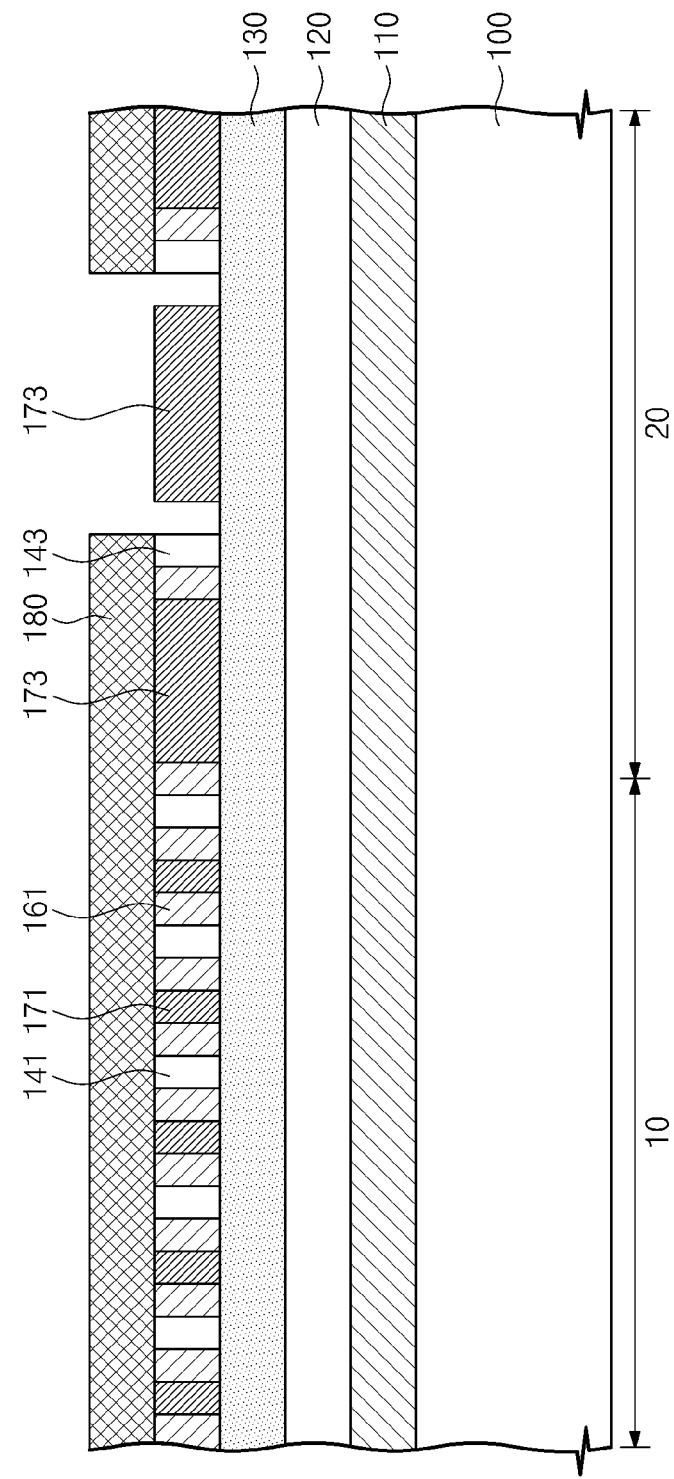

Referring to FIG. 8, the second spacers 161 exposed by the trimming mask pattern 180 may be selectively removed. In some embodiments, the exposed second spacers 161 may be selectively removed using an isotropic etching process, for example. In the case that the second spacers 161 may be formed of a material having an etch selectivity with respect to the upper mask patterns 143 and the second gap-filling patterns 173, the isotropic etching process may be performed to etch the exposed second spacers 161 using an etch recipe having an etch selectivity with respect to the upper mask patterns 143 and the second gap-filling patterns 173.

For instance, in the case that the second spacer 161 is formed of silicon oxide, the isotropic etching process may be performed using an etch solution containing at least one of diluted HF or $NH_4F$, as examples. The diluted HF may be a mixture of deionized water and HF in a volume ratio of about 50:1, for instance. In other embodiments, the second spacers 161 of silicon oxide may be removed using a dry etching process. For instance, the second spacers 161 may be removed using an etching gas containing a CxFy gas, where each of x and y is an integer between 1 and 10. Alternatively, the etching gas may contain a mixture gas of CxFy and $O_2$ or a mixture gas of CxFy, $O_2$ and Ar. In some embodiments, the CxFy gas may be at least one gas of $C_3F_6$, $C_4F_6$, $C_4F_8$, or $C_5F_8$, as examples. The oxygen gas in the etching gas may contribute to removal of polymeric byproducts occurring during the etching process and to decomposition of the CxFy gas. The argon gas in the etching gas may serve as a carrier gas or contribute to ion bombardment.

Figure 9:
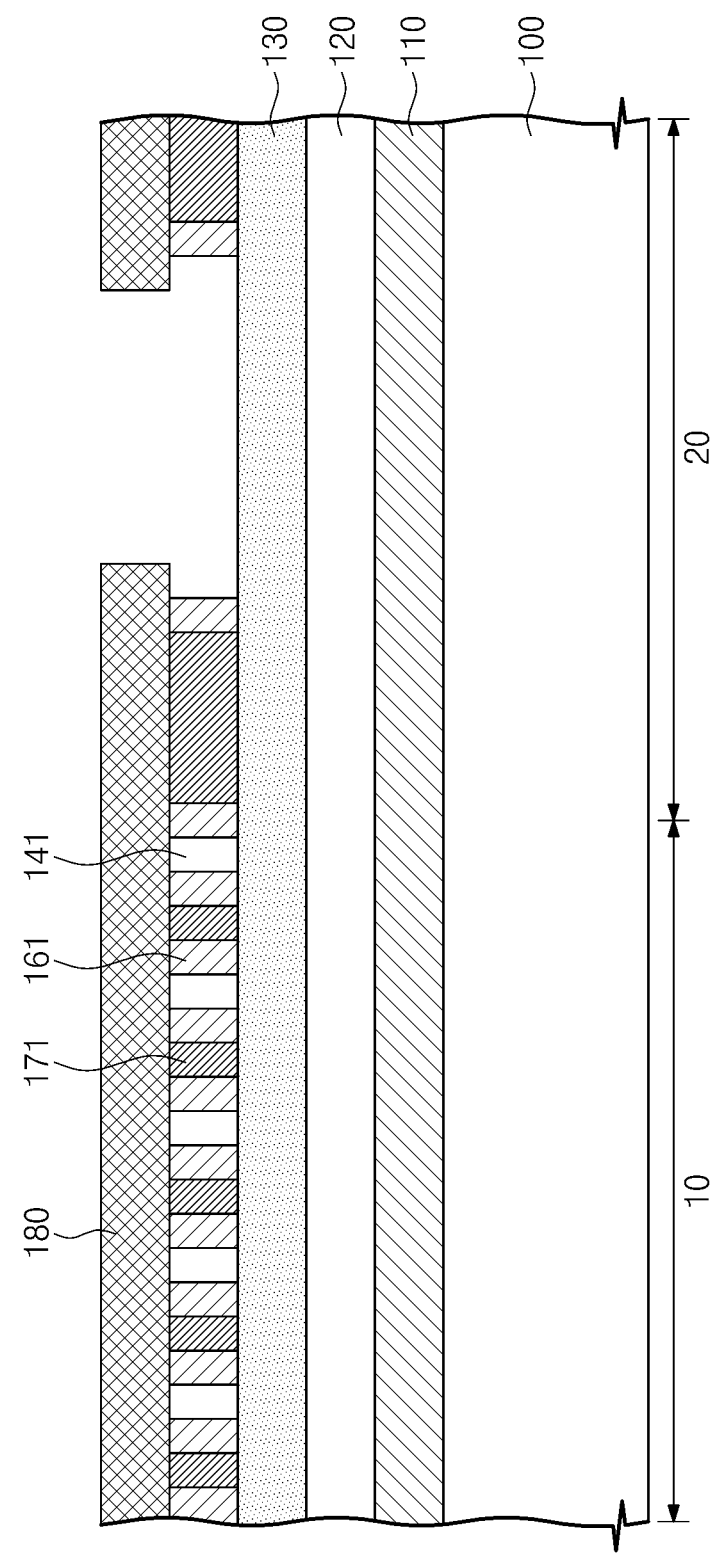

Referring to FIG. 9, the upper mask patterns 143 and the second gap-filling pattern 173 exposed by the trimming mask pattern 180 may be removed. In the case that the upper mask patterns 143 and the second gap-filling pattern 173 are formed of the same material, the upper mask patterns 143 and the second gap-filling pattern 173 may be simultaneously removed using an isotropic etching process.

By contrast, in the case that the upper mask pattern 143, the second spacer 161, and the second gap-filling pattern 173 are formed of different materials, they may be sequentially and isotropically removed using different etch recipes from each other. During the isotropic etching of one pattern of the mask structure (e.g., the second spacer 161), another pattern of the mask structure (e.g., the upper mask pattern 143) adjacent thereto may serve as an etch stop layer preventing an unintended etching of the remaining portion of the mask structure.

Figure 10:
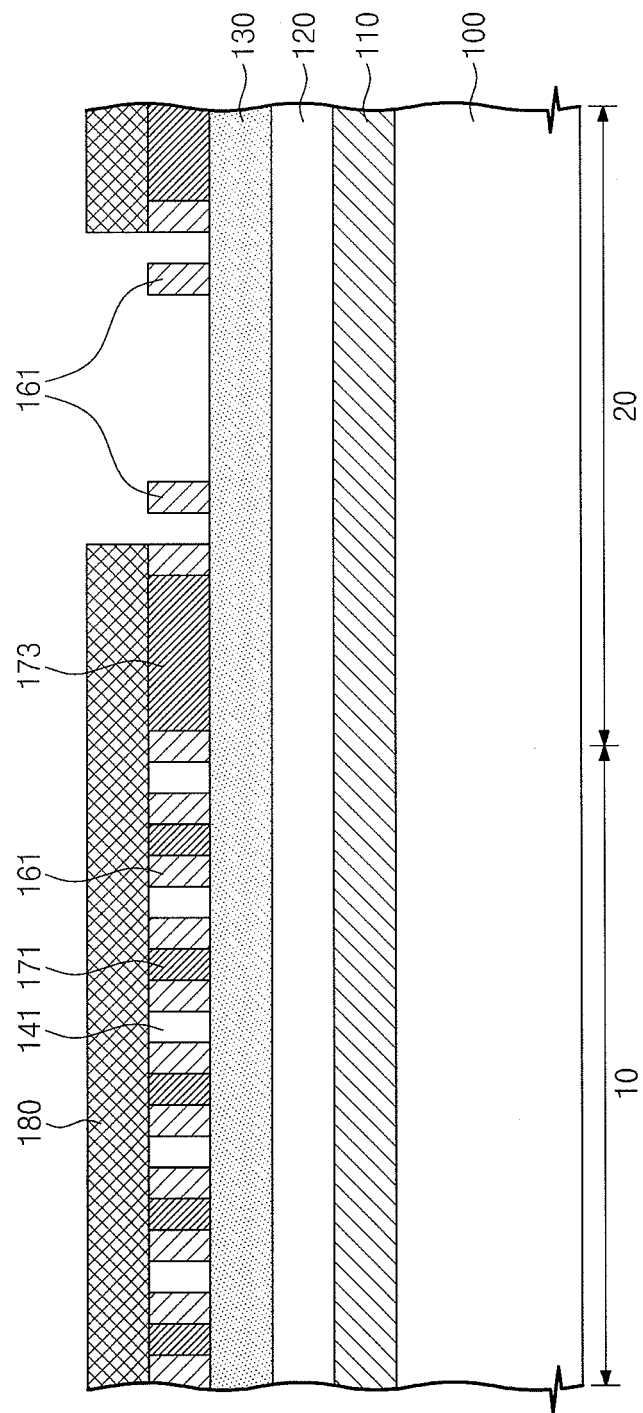

In other embodiments, as shown in FIG. 10, the trimming mask pattern 180 may be formed to expose the upper mask patterns 143, the second spacers 161, and the second gap-filling pattern 173 in the second region. After the formation of the trimming mask pattern 180, the upper mask patterns 143 and the second gap-filling pattern 173 exposed by the trimming mask pattern 180 may be removed using an isotropic etching process. In this case, as shown, the second spacers 161 between the upper mask patterns 143 and the second gap-filling pattern 173 may remain, as shown in FIG. 10.

Figure 11:
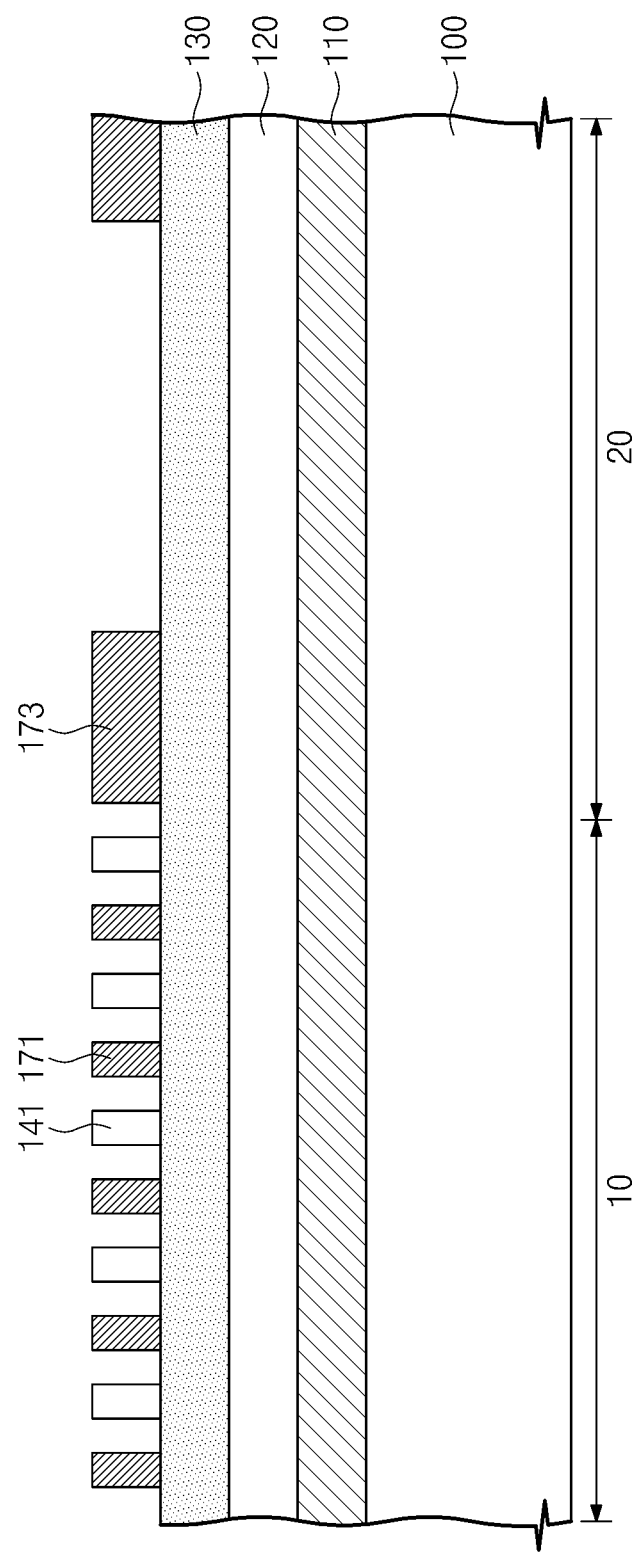

Thereafter, referring to FIG. 11, the trimming mask pattern 180 and the second spacers 161 may be removed. In some embodiments, the trimming mask pattern 180 and the second spacers 161 may be sequentially removed. In the case that the second spacers 161 are formed of silicon oxide, the second spacers 161 may be removed using an etching solution containing fluorine F, as an example. For instance, the second spacers 161 may be removed using a mixture of deionized water and HF (i.e., diluted HF) in a volume ratio of about 50:1.

As a result, as shown in FIG. 11, the first gap-filling patterns 171 and the upper mask patterns 141 having fine (or narrow) widths are arranged in an alternating manner on the first region 10, and the second gap-filling patterns 173 spaced apart from each other are arranged on the second region 20. According to example embodiments of the inventive concepts, the width of the second spacer 161 may determine an interval between the first gap-filling pattern 171 and the upper mask pattern 141 that are disposed adjacent to each other in the first region 10.

Figure 12:
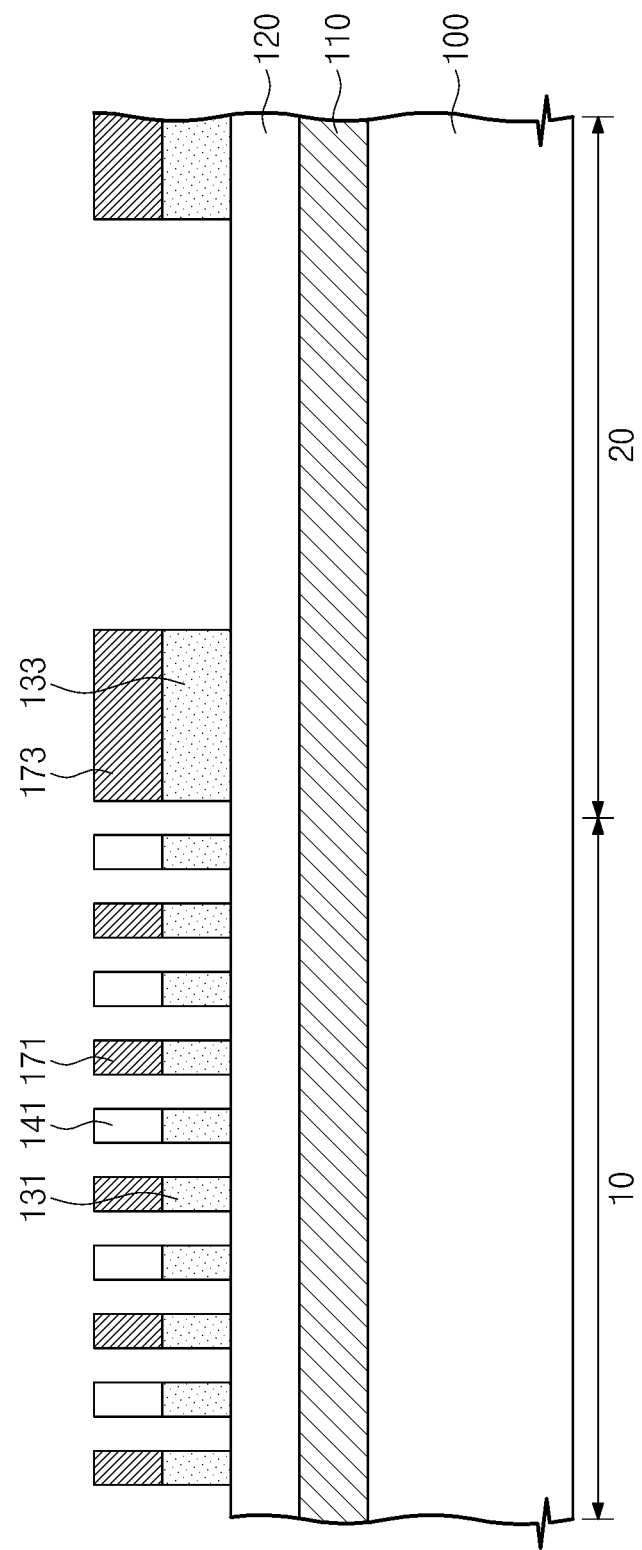

Referring to FIG. 12, the first hardmask layer 130 may be patterned using the first and second gap-filling patterns 171 and 173 and the upper mask patterns 141 as a patterning mask to form lower mask patterns 131 and 133 on the capping layer 120. The lower mask patterns 131 and 133 may be disposed on the first and second regions 10 and 20, respectively, and have different widths from each other. In some embodiments, the lower mask patterns 131 and 133 may be simultaneously formed.

Figure 13:
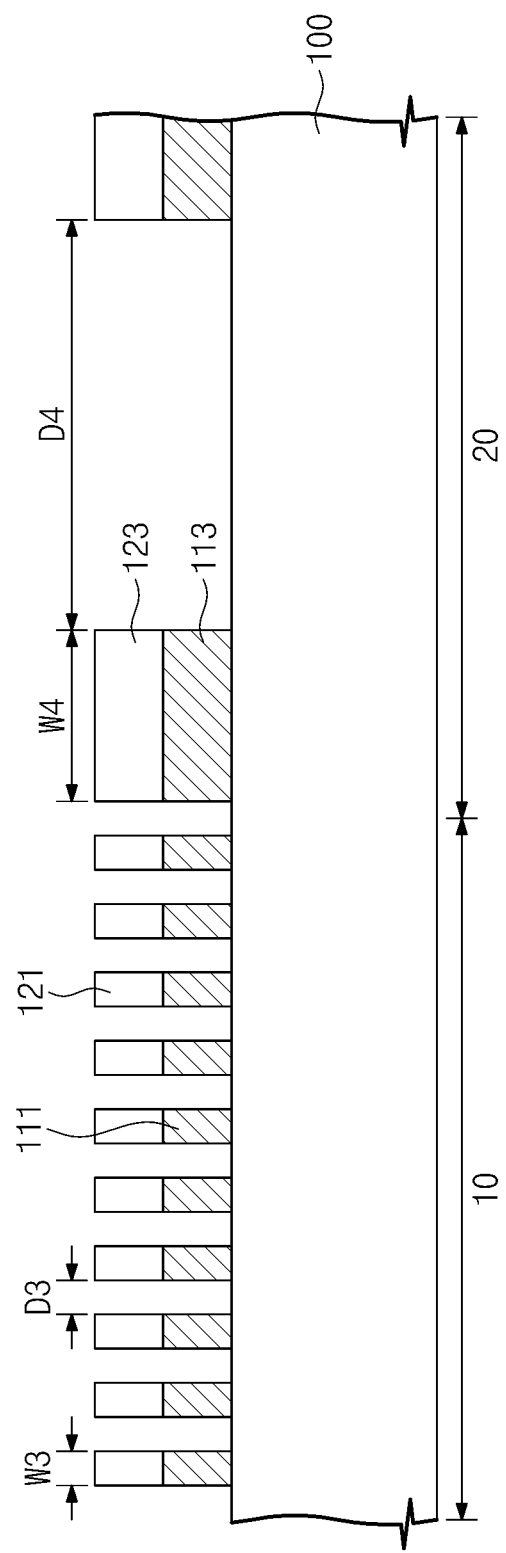

Referring to FIG. 13, thereafter, the underlying layer 110 and the capping layer 120 on the semiconductor substrate 100 may be patterned using the lower mask patterns 131 and 133 as a patterning mask to form stacking structures on the semiconductor substrate 100. The stacking structures may include a first stacking structure with a conductive pattern 111 and a capping pattern 121 sequentially stacked in the first region 10 and a second stacking structure with a conductive pattern 113 and a capping pattern 123 sequentially stacked in the second region 20, as shown in FIG. 13.

According to example embodiments of the inventive concepts, the conductive pattern 111 of the first stacking structure may be a narrow-width pattern having a first width W3 that is smaller than a specific dimension. For instance, the first width W3 may be smaller than a dimension feasible with a photolithography process to be used for fabricating the device. In some embodiments, the first width W3 may be in a range of about 10 nm to about 40 nm, as an example. The conductive pattern 113 of the second stacking structure may be a wide-width pattern having a second width W4 that is greater than the first width W3.

In the first region 10, the narrow-width conductive patterns 111 may be arranged at a first interval D3, which may be equivalent to the first width W3, while in the second region 20, the wide-width conductive patterns 113 may be arranged at a second interval D4, which may be equivalent to or greater than the second width W4.

In some embodiments, the first width W3 of the narrow-width conductive pattern 111 may be substantially equivalent to one-third, or thereabout, of the width W1 of the first photoresist pattern 151 shown in FIG. 1.

The second width W4 of the wide-width conductive pattern 113 may be substantially equivalent to a dimension obtained by subtracting the pitch W3+D3 or twice the width W3 of the narrow-width conductive pattern 111 from the width W2 of the second photoresist pattern 153. In certain embodiments, the second width W4 may be three to five times the first width W3.

According to some embodiments, the narrow-width conductive patterns 111 may be formed through two steps of forming the spacers and one step of forming the first and second gap-filling patterns. In some embodiments, the interval D3 between the narrow-width patterns 111 may be one-fifth of the interval D1 between the first photoresist patterns 151 shown in FIG. 1, while the interval D4 between the wide-width patterns 113 may vary according to the interval D2 between the second photoresist patterns 153 shown in FIG. 1.

Figure 14:
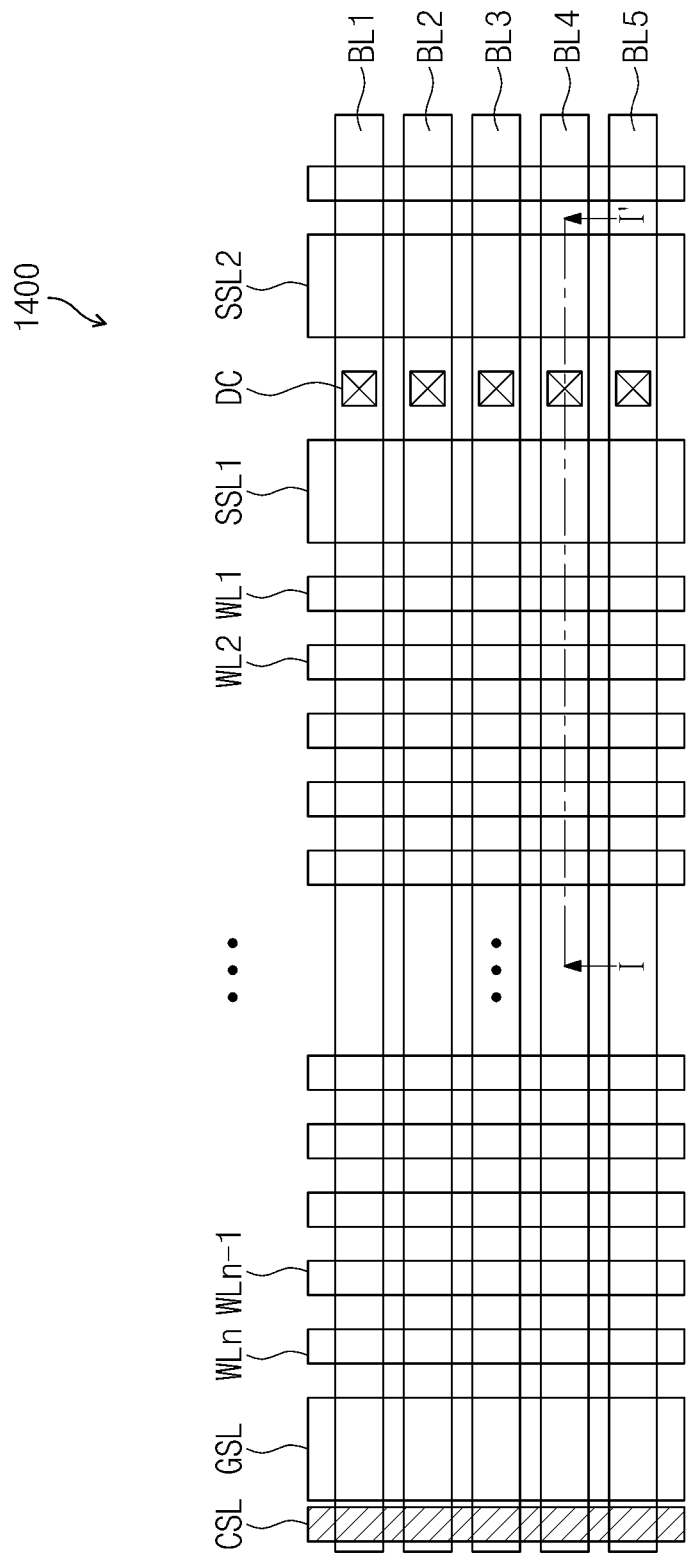
Figure 15:
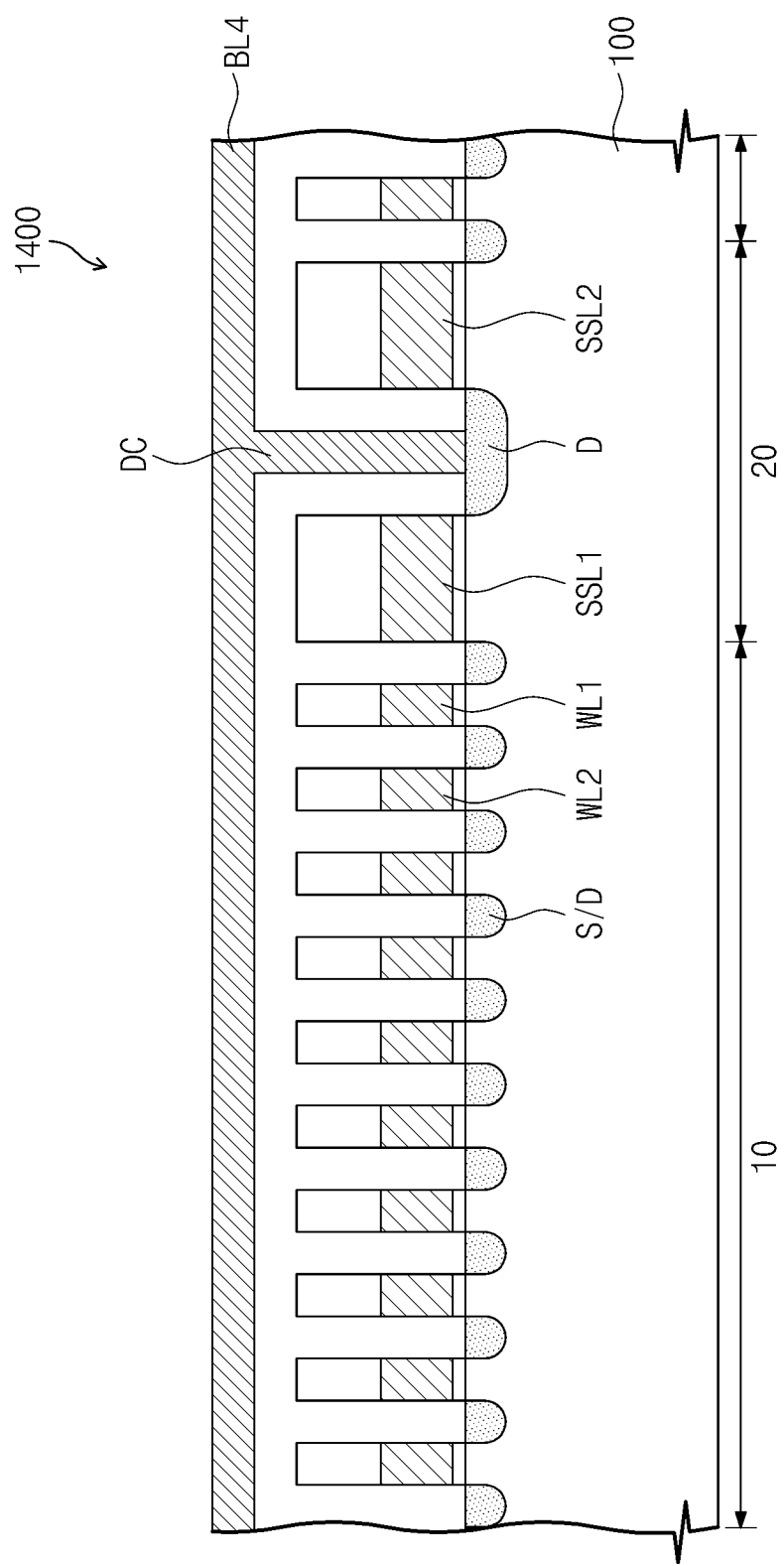

FIG. 14 is a plan view of a NAND FLASH memory device 1400 fabricated by a method of forming fine patterns according to example embodiments of the inventive concepts, and FIG. 15 is a sectional view of the NAND FLASH memory device according to example embodiments of the inventive concepts, taken along a line I-I' of FIG. 14.

Referring to FIGS. 14 and 15, a NAND FLASH memory device may include a cell array region comprising the first region 10 and the second region 20, which is provided with a plurality of cell strings.

Each of the cell strings may include ground and string selection transistors connected to a source region CSL and a drain region D, respectively, and a plurality of cell transistors disposed in series between the ground and string selection transistors. To make this configuration, a ground selection gate line GSL, a string selection gate line SSL1, and a plurality of word lines WL1 to WLn interposed between the string selection gate line SSL1 and the ground selection gate line GSL may be disposed in the cell array region 10 and 20. The drain regions D of the cell strings may be connected to bit lines BL1 to BL5, respectively, crossing over the word lines WL1 to WL5 via bit line contact plugs DC. In addition, the source regions CSL of the cell strings may extend parallel to the word lines WL1 to WLn to form a common source line. In other words, the common source line may be the source regions CSL connected to each other along a direction parallel to the word lines WL1 to WLn, as is shown in FIG. 14.

In the NAND FLASH memory device 1400, the word lines WL1 to WLn, the ground and string selection gate lines GSL and SSL1 may be formed using the method of forming fine patterns described with reference to FIGS. 1 through 13. That is, the word lines WL1 to WLn may be correspond to the narrow-width conductive patterns 111 in the first region 10 described with reference to FIGS. 1 through 13, while the ground and string selection gate lines GSL and SSL1 may be correspond to the wide-width conductive patterns 113 in the second region 20.

Figure 16:
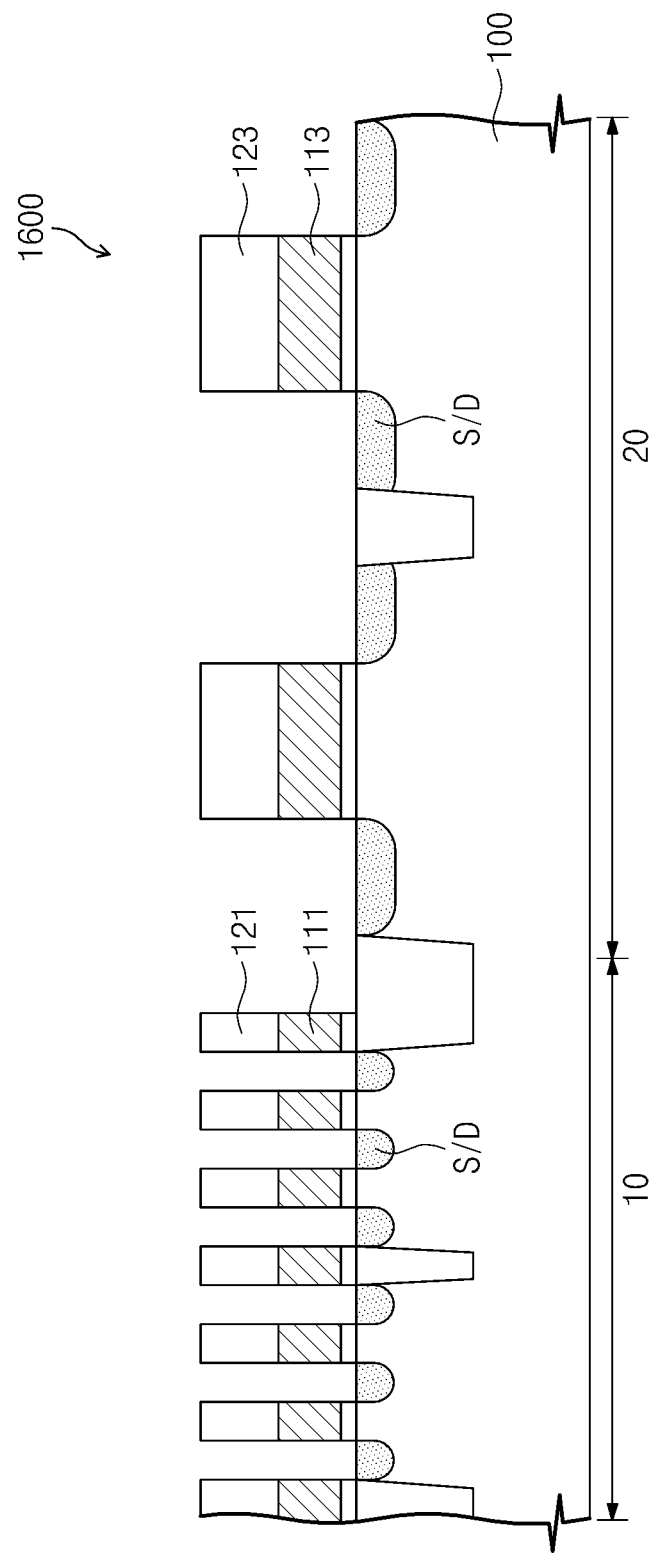
FIG. 16 is a sectional view of an embodiment of a semiconductor memory device having fine patterns fabricated by a method according to aspects of the present invention.

FIG. 16 is a sectional view of another semiconductor memory device fabricated by a method of forming fine patterns according to example embodiments of the inventive concepts.

Referring to FIG. 16, a semiconductor memory device 1600 may include a cell array region corresponding to first region 10 provided with memory cells and a peripheral circuit region corresponding to second region 20 provided with peripheral circuits for operating the memory cells.

The semiconductor memory device 1600 can be variously classified according to the type of memory cells to be integrated in the cell array region 10; for instance, a dynamic random access memory (DRAM), a static RAM (SRAM), a phase changeable RAM (PRAM), a resistance RAM (RRAM), a magnetic RAM (MRAM), and a ferroelectric RAM (FRAM), as examples. In other embodiments, a micro-electro-mechanical systems (MEMS) device, an optoelectronic device, or a processor, such as CPU or DSP, may be provided on the semiconductor substrate 100.

Word lines 111 may be provided on the cell array region 10 of the semiconductor substrate 100 to serve as gate electrodes of MOS transistors. In some embodiments, the cell array region 10 may correspond to the first region 10 described with reference to FIGS. 1 through 13, and the word lines 111 may correspond to the narrow-width patterns 111 described with reference to FIGS. 1 through 13. Gate electrodes 113 and source and drain electrodes S/D may be provided on the peripheral circuit region 20 of the semiconductor substrate 100 to form MOS transistors serving as a portion of the peripheral circuit. The gate electrodes 113 in the peripheral circuit region 20 may correspond to the wide-width patterns 113 in the second region 20 described with reference to FIGS. 1 through 13.

According to example embodiments of the inventive concepts, a method of forming fine patterns can be used to simultaneously form a narrow pattern having a smaller width than the minimum feature size and a wide pattern having a greater width than that of the narrow pattern, without an increase in the number of photolithography processes.

While example embodiments of the inventive concepts have been particularly shown and described, it will be understood by one of ordinary skill in the art that variations in form and detail may be made therein without departing from the spirit and scope of the attached claims.

What is claimed is:

1. A method of forming fine patterns in a semiconductor device, comprising:
forming an underlying layer with a first region and a second region;
forming hardmask patterns on the underlying layer, the hardmask patterns having the substantially same width but being arranged at intervals different in the first region from in the second region;
forming spacers on both sidewalls of each of the hardmask patterns;
forming gap-filling patterns to fill gap regions between the spacers;
forming a trimming mask pattern to expose at least one of the gap-filling patterns on the second region;
performing a trimming process to remove the gap-filling pattern exposed by the trimming mask pattern and a pair of the hardmask patterns adjacent to the exposed gap-filling pattern; and
removing the trimming mask pattern and the spacers and patterning the underlying layer using the gap-filling patterns and the hardmask patterns as an etch mask to simultaneously form narrow-width patterns on the first region and wide-width patterns on the second region.

2. The method of claim 1, wherein a width of the gap-filling pattern on the first region is the substantially same as a width of the spacer.

3. The method of claim 1, wherein the spacers is formed of a material having an etch selectivity with respect to the gap-filling patterns and the upper mask patterns, and
the trimming process comprises:
isotropically etching the gap-filling pattern exposed by the trimming mask pattern and the spacers adjacent to the exposed gap-filling pattern to expose sidewalls of the upper mask pattern and the gap-filling pattern; and
simultaneously and isotropically etching the upper mask pattern and the gap-filling pattern whose sidewalls are exposed.

4. The method of claim 1, wherein the trimming mask pattern is formed to expose top surfaces of the exposed gap-filling pattern on the second region and the spacers adjacent to the exposed gap-filling pattern.

5. The method of claim 1, wherein the gap-filling patterns are formed of a material having an etch selectivity with respect to the spacers, and selected from a group consisting of silicon oxide, silicon nitride, silicon oxynitride, polysilicon, and a carbon-containing layer.

6. The method of claim 1, wherein the forming of the hardmask patterns comprises:
forming a hardmask layer on the underlying layer;
forming photoresist patterns on the hardmask layer;
forming sacrificial spacers on both sidewalls of the photoresist patterns; and
pattering the hardmask layer using the sacrificial spacers as a patterning mask.

7. The method of claim 6, wherein a width of the photoresist pattern on the first region is smaller than a width of the photoresist pattern on the second region.

8. The method of claim 6, wherein a width of the wide-width pattern is smaller than a width of the photoresist pattern on the second region.

9. The method of claim 6, wherein the hardmask layer is formed of at least one of silicon oxide, silicon nitride, silicon oxynitride, polysilicon, a carbon-containing layer, and any combination thereof.

10. The method of claim 1, wherein the narrow-width patterns and the wide-width patterns form a portion of a memory cell array.

11. The method of claim 1, wherein the narrow-width patterns form a portion of a memory cell array and the wide-width patterns form a portion of a peripheral circuit connected to the memory cell array.

12. A method of forming fine patterns in a semiconductor device, comprising:
forming a lower mask layer on an underlying layer having a first region and a second region;
forming upper mask patterns on the lower mask layer, with intervals between the upper mask patterns being greater in the second region than in the first region;
forming spacers on both sidewalls of each of the upper mask patterns;
forming gap-filling patterns to fill gap regions between adjacent ones of the spacers, with widths of the gap-filling patterns being greater in the second region than in the first region;
forming a trimming mask pattern to expose at least one of the gap-filling patterns on the second region;
performing a trimming process to remove the gap-filling pattern exposed by the trimming mask pattern and a pair of the upper mask patterns adjacent to the exposed gap-filling pattern;
removing the trimming mask pattern and the spacers and patterning the lower mask layer using the upper mask patterns and the gap-filling patterns as an etch mask to form lower mask patterns whose widths are different in the first region from in the second region; and
patterning the underlying layer using the lower mask patterns as a patterning mask to simultaneously form narrow-width patterns and wide-width patterns having different widths.

13. The method of claim 12, wherein the spacers are formed of a material having an etch selectivity with respect to the gap-filling patterns and the upper mask patterns, and
the trimming process comprises:
isotropically etching the gap-filling pattern exposed by the trimming mask pattern and the spacers adjacent to the exposed gap-filling pattern to expose sidewalls of the upper mask pattern and the gap-filling pattern; and
simultaneously and isotropically etching the upper mask pattern and the gap-filling pattern having exposed sidewalls.

14. The method of claim 12, wherein the forming of the upper mask patterns comprises:
forming an upper mask layer on the lower mask layer;
forming photoresist patterns on the upper mask layer, widths of the photoresist patterns being greater in the second region than in the first region;
forming sacrificial spacers on both sidewalls of each of the photoresist patterns; and
patterning the upper mask layer using the sacrificial spacers as an etch-mask.

15. The method of claim 12, wherein a width of the wide-width pattern is smaller than a width of the photoresist pattern disposed on the second region.

16. A method of forming a semiconductor device having fine patterns, comprising:
sequentially forming an underlying layer, a capping layer, and a hardmask layer on a substrate having first and second regions;
forming first and second photoresist patterns on the hardmask layer using a photolithography process, the first and second photoresist patterns having widths that are equal to or greater than a resolution width of the photolithography process;

forming first spacers on sidewalls of the photoresist pattern;

forming upper mask patterns in the hardmask layer using the photoresist patterns, wherein the upper mask patterns in the first region have a smaller interval than the upper mask patterns in the second region;

forming spacers in sidewalls of the upper mask patterns, and filling gaps between the spacers with a gap-filling pattern;

removing a portion of the gap-filling pattern in the second region and then removing the spacers in the first and second regions; and forming narrow-width patterns in the first region and wide-width patterns in the second region by patterning the capping layer and underlying layer using the remaining upper mask patterns and remaining gap filling pattern, wherein a width of the narrow-width patterns is smaller than the resolution width of the photolithography process.

17. The method of claim 16, wherein the narrow-width patterns and wide-width patterns are stacking structures formed on the semiconductor substrate and comprising portions of the capping layer and the underlying layer.

18. The method of claim 16, further comprising:
forming memory cells in the first region; and
forming peripheral circuits for operating the memory cells in the second region.

19. The method of claim 16, further comprising:
forming a cell array region comprising the first region and the second region, including a plurality of cell strings, wherein each of the cell strings includes ground and string selection transistors connected to a source region and a drain region, respectively, and a plurality of cell transistors disposed in series between the ground and string selection transistors; and providing in the cell array region a ground selection gate line, a string selection gate line, and a plurality of word lines interposed between the string selection gate line and the ground selection gate line may be disposed, wherein the word lines correspond to the narrow-width patterns in the first region and the ground and string selection gate lines correspond to the wide-width patterns in the second region.

* * * * *